(12) United States Patent
Koschinsky et al.

(10) Patent No.: US 9,147,618 B2
(45) Date of Patent: Sep. 29, 2015

(54) METHOD FOR DETECTING DEFECTS IN A DIFFUSION BARRIER LAYER

(71) Applicant: GLOBALFOUNDRIES Inc., Grand Cayman (KY)

(72) Inventors: Frank Koschinsky, Radebeul (DE); Bernd Hintze, Langebrueck (DE); Dirk Utess, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/060,147

(22) Filed: Oct. 22, 2013

(65) Prior Publication Data

US 2015/0111316 A1    Apr. 23, 2015

(51) Int. Cl.
*H01L 21/66* (2006.01)
*H01L 23/532* (2006.01)
*H01L 21/768* (2006.01)

(52) U.S. Cl.
CPC .......... *H01L 22/12* (2013.01); *H01L 21/76864* (2013.01); *H01L 23/53233* (2013.01); *H01L 23/53238* (2013.01); *H01L 23/53295* (2013.01)

(58) Field of Classification Search
CPC ......... H01L 22/00; H01L 22/34; H01L 22/20; H01L 2924/14; H01L 2924/01079; H01L 22/22; H01L 2924/3011; H01L 22/12; H01L 22/26; H01L 22/10; G11C 29/006; B24B 37/013; G01N 21/9501
USPC ................. 257/14–18, FOR. 101, FOR. 142; 438/E27.14, E21.521, E21.525, 438/E21.526, E21.528, E21.529, E21.5, 3
See application file for complete search history.

(56) References Cited

U.S. PATENT DOCUMENTS

| | | | |
|---|---|---|---|
| 2006/0172552 A1* | 8/2006 | Ajmera et al. | 438/778 |
| 2008/0160654 A1 | 7/2008 | Meyer et al. | |
| 2008/0258056 A1* | 10/2008 | Zaykova-Feldman et al. | 250/307 |
| 2010/0084277 A1* | 4/2010 | Park et al. | 205/95 |
| 2010/0154213 A1* | 6/2010 | Koike et al. | 29/874 |
| 2012/0061838 A1* | 3/2012 | Edelstein et al. | 257/751 |
| 2012/0258388 A1* | 10/2012 | Yamada et al. | 430/5 |

* cited by examiner

*Primary Examiner* — Thao X Le
*Assistant Examiner* — Nduka Ojeh
(74) *Attorney, Agent, or Firm* — Amerson Law Firm, PLLC

(57) ABSTRACT

A method of providing a semiconductor structure comprising a diffusion barrier layer and a seed layer, the seed layer comprising an alloy of copper and a metal other than copper, depositing an electrically conductive material on the seed layer, performing an annealing process, wherein at least a first portion of the metal other than copper diffuses away from a vicinity of the diffusion barrier layer through the electrically conductive material, and wherein, in case of a defect in the diffusion barrier layer, a second portion of the metal other than copper indicative of the defect remains in a vicinity of the defect, measuring a distribution of the metal other than copper in at least a portion of the semiconductor structure, and determining, from the measured distribution of the metal other than copper, if the second portion of the metal other than copper is present.

20 Claims, 6 Drawing Sheets

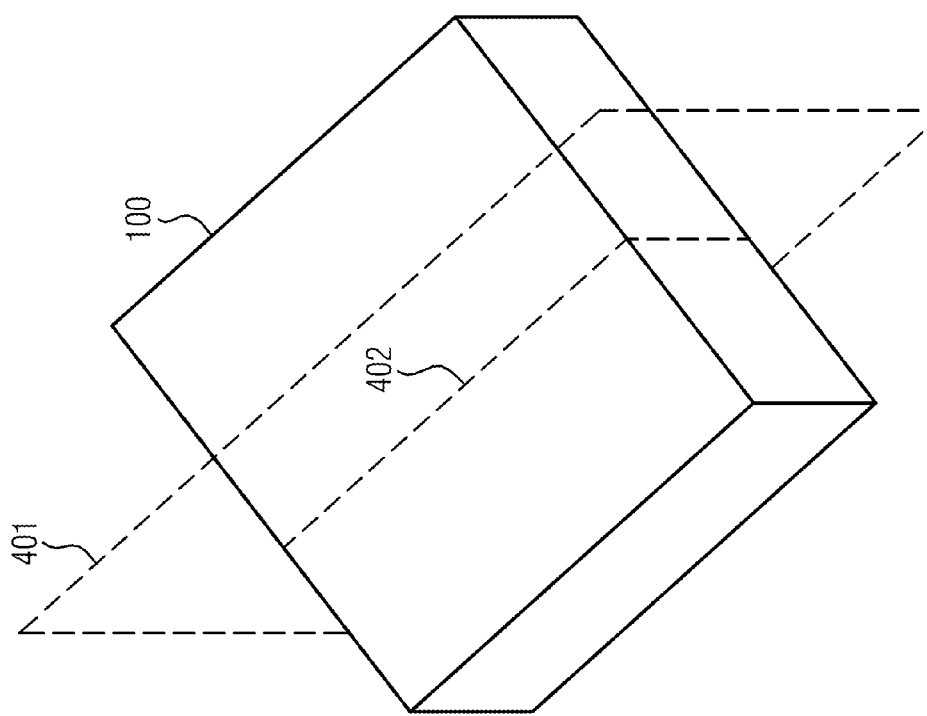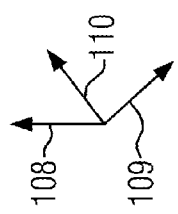
FIG. 4

METHOD FOR DETECTING DEFECTS IN A DIFFUSION BARRIER LAYER

BACKGROUND OF THE INVENTION

1. Field of the Invention

Generally, the present disclosure relates to the field of integrated circuits, and, more particularly, to integrated circuits wherein a diffusion barrier layer is employed for substantially avoiding or at least reducing a diffusion of an electrically conductive material.

2. Description of the Related Art

Integrated circuits include a number of individual circuit elements, such as, for example, transistors, capacitors, diodes and resistors, which are interconnected by means of electrically conductive lines. The electrically conductive lines may be formed of an electrically conductive material including copper, such as substantially pure copper or a copper alloy, for example, an alloy of copper and aluminum. For forming the electrically conductive lines, damascene techniques may be employed.

In damascene techniques, trenches and contact vias are formed in an interlayer dielectric, which may include silicon dioxide and/or a low-k material having a smaller dielectric constant than silicon dioxide. In the trenches and contact vias, a diffusion barrier layer may be formed. After the formation of the diffusion barrier layer, the trenches and contact vias may be filled with the electrically conductive material including copper. This may be done by means of electroplating for depositing the electrically conductive material and chemical mechanical polishing for removing portions of the electrically conductive material deposited outside the trenches and contact vias.

The diffusion barrier layer may help to substantially avoid or at least reduce a diffusion of copper from the electrically conductive material into the interlayer dielectric and/or other portions of the semiconductor structure, which might adversely affect the functionality of the integrated circuit.

Issues that can occur in the above-described damascene process may include a formation of defects in the diffusion barrier layer, such as pores and/or cracks. Defects in the diffusion barrier layer may allow an undesirable diffusion of copper from the electrically conductive material into the interlayer dielectric and/or other portions of the semiconductor structure. Additionally, defects of the diffusion barrier layer may induce an insufficient filling of contact vias and/or trenches, such that voids are created in the electrically conductive material. Such voids may increase the electrical resistance of electrically conductive lines, and the presence of voids may increase the likelihood of electromigration and/or stress migration occurring. In the operation of an integrated circuit having a diffusion barrier layer including defects, the defects in the diffusion barrier layer may lead to an increased diffusion of copper due to electromigration and/or stress migration. A formation of voids within electrically conductive lines may be a severe reliability risk.

Therefore, methods for testing the integrity of a diffusion barrier layer may be employed in the manufacturing of integrated circuits for developing methods of forming a diffusion barrier layer which substantially eliminate or at least reduce the likelihood of the formation of defects in the diffusion barrier layer and/or for monitoring processes employed for forming a diffusion barrier layer in the manufacturing of integrated circuits.

U.S. Publication No. 2008/0160654 discloses exposing a semiconductor structure, including an electrically conductive feature formed of a first material including copper and a diffusion barrier layer formed on the electrically conductive feature and including a second material, to an etchant adapted to selectively remove the first material, leaving the second material substantially intact. The etchant may include, for example, ammonium peroxydisulfate.

If the diffusion barrier layer including the second material has defects, such as, for example, pores, the etchant can contact the first material in the electrically conductive feature. Thus, the electrically conductive feature is affected by the etchant, which may lead to the formation of a cavity in the electrically conductive feature. Conversely, if the diffusion barrier layer is intact and does not include defects, the diffusion barrier layer can prevent a contact between the etchant and the first material in the electrically conductive feature below the diffusion barrier layer. Thus, the electrically conductive feature is protected from being affected by the etchant, and no cavity is formed.

The presence of cavities in the electrically conductive feature can then be detected by means of techniques of microscopy, wherein the presence of cavities indicates the occurrence of defects in the diffusion barrier layer.

Other techniques for testing the integrity of diffusion barrier layers may include an HF dip, wherein a semiconductor structure is exposed to hydrofluoric acid (HF) after the deposition of a diffusion barrier layer on an interlayer dielectric. If there are defects in the diffusion barrier layer, the interlayer dielectric is affected by the hydrofluoric acid, which can be detected by means of techniques of microscopy. Further techniques for testing the integrity of a diffusion barrier layer may include inline electrical barrier measurements on trenches filled with an electrically conductive material, Kelvin vias and via chains. In these techniques, defects are detected by electrical measurements on electrically conductive features in semiconductor structures including an electrically conductive material and diffusion barrier layers.

The above-described techniques for detecting defects in diffusion barrier layers may have issues associated therewith. Techniques such as those described in U.S. Publication No. 2008/0160654 or the HF dip are associated with a destruction of portions of the semiconductor structure adjacent the diffusion barrier layer, such as the electrically conductive material of the electrically conductive line and/or the interlayer dielectric. Electrical barrier measurements may have a limited sensitivity with respect to small defects.

In view of the situation described above, the present disclosure provides methods wherein some or all of the above-mentioned issues may be substantially avoided or at least reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure including a diffusion barrier layer and a seed layer provided on the diffusion barrier layer. The seed layer includes an alloy of copper and a metal other than copper. An electrically conductive material including copper is deposited on the seed layer. An annealing process is performed. In the annealing process, at least a first portion of the metal other than copper diffuses away from a vicinity of the diffusion barrier layer through the electrically conductive material. In case of a defect in the diffusion barrier layer, a second portion of the metal other than copper indicative of the defect remains in a vicinity of the defect in the diffusion barrier layer. A distribution of the metal other than copper is measured in at least a portion of the semiconductor structure. From the measured distribution of the metal other than copper, it is determined if the second portion of the metal other than copper is present.

Another illustrative method disclosed herein includes providing a semiconductor structure. The semiconductor structure includes an interlayer dielectric provided above a substrate. In the interlayer dielectric, a recess is provided. The recess includes at least one of a contact via and a trench. On at least one of a bottom and a sidewall of the recess, a diffusion barrier layer is provided. The diffusion barrier layer includes at least one of titanium, tantalum, tungsten, titanium nitride, tantalum nitride and tungsten nitride. On the diffusion barrier layer, a seed layer including an alloy of copper and manganese is provided. On the seed layer, an electrically conductive material including copper is deposited. The deposited electrically conductive material substantially does not include manganese. An annealing process is performed. In the annealing process, at least a first portion of the manganese diffuses away from a vicinity of the diffusion barrier layer through the electrically conductive material. In case of a defect in the diffusion barrier layer, a second portion of the manganese indicative of the defect remains in a vicinity of the defect in the diffusion barrier layer. A distribution of manganese is measured in at least a portion of the semiconductor structure. From the measured distribution of manganese, it is determined if the second portion of the manganese is present.

A further illustrative method disclosed herein includes providing a semiconductor structure including an interlayer dielectric and an electrically conductive feature that is at least partially surrounded by the interlayer dielectric. The electrically conductive feature includes an electrically conductive material including copper and a diffusion barrier layer including at least one of a metal and a metal nitride between the electrically conductive material and the interlayer dielectric. Analytical electron microscopy is performed to determine if the semiconductor structure includes manganese and, if the semiconductor structure includes manganese, to measure a distribution of the manganese. From the measured distribution of the manganese, it is determined if a portion of the manganese in a vicinity of the diffusion barrier layer is present.

BRIEF DESCRIPTION OF THE DRAWINGS

The disclosure may be understood by reference to the following description taken in conjunction with the accompanying drawings, in which like reference numerals identify like elements, and in which:

FIG. 4 shows a schematic perspective view illustrating a preparation of a sample from a semiconductor structure in a method according to an embodiment;

Figure 1:
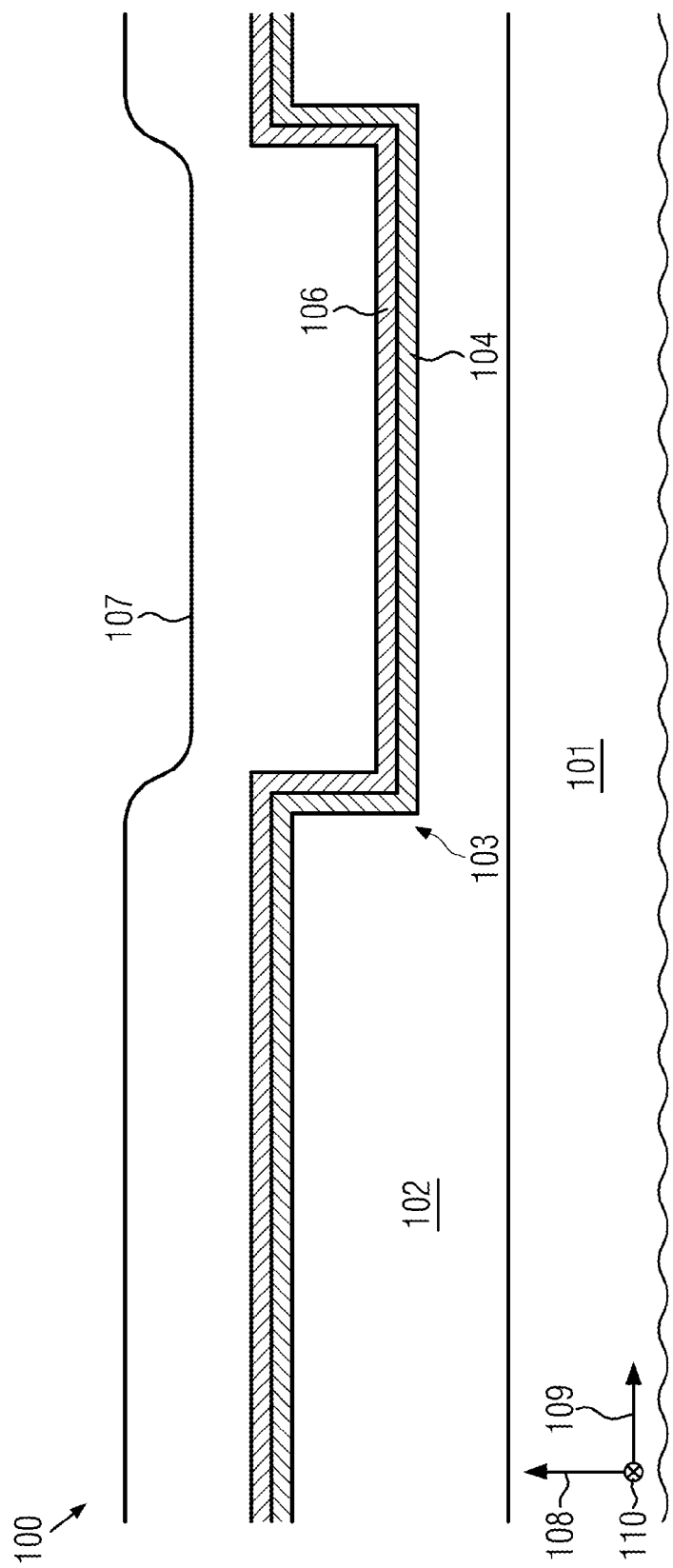
FIGS. 1-3 show schematic cross-sectional views of a semiconductor structure in stages of a method according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

FIG. 1 shows a schematic cross-sectional view of a semiconductor structure 100 in a stage of a method according to an embodiment. The semiconductor structure 100 includes a substrate 101. The substrate 101 may include a bulk semiconductor substrate, for example a silicon wafer or die. In other embodiments, the substrate 101 may include a semiconductor-on-insulator (SOI) substrate including a semiconductor layer, for example a silicon layer, that is provided above a support substrate which may be, for example, a silicon wafer or die, and is separated from the support substrate by a layer of an electrically insulating material, such as, for example, silicon dioxide. In and on the substrate 101, circuit elements (not shown) such as transistors, resistors, diodes and/or capacitors may be provided.

The substrate 101 and circuit elements provided on and in the substrate 101 may be formed by means of known techniques for forming substrates of and circuit elements in integrated circuits.

The substrate 101 has a thickness direction 108, wherein an extension of the substrate 101 in the thickness direction 108 is smaller than any extension of the substrate 101 in any other direction. The thickness direction 108 may be substantially perpendicular to a surface of the substrate 101 on which circuit elements are formed.

In FIG. 1, reference numerals 109 and 110 denote a first horizontal direction and a second horizontal direction, respectively, wherein the first horizontal direction 109 and the second horizontal direction 110 are perpendicular to each other and to the thickness direction 108. In the cross-sectional view of FIG. 1, the first horizontal direction 109 is horizontal, and the second horizontal direction 110 extends perpendicularly to the plane of the drawing, pointing away from the viewer, as indicated by a circle with an 'x' in the center. The thickness direction 108 extends vertically in the cross-sectional view of FIG. 1.

Above the substrate 101, an interlayer dielectric 102 may be provided. The interlayer dielectric 102 need not be provided directly on the substrate 101, as shown in FIG. 1. In some embodiments, layers of interlayer dielectric (not shown) other than the interlayer dielectric 102, which may include electrically conductive lines of lower interconnect levels provided by trenches and/or vias filled with an electrically conductive material, may be arranged between the substrate 101 and the interlayer dielectric 102.

In some embodiments, the interlayer dielectric 102 may include silicon dioxide. In other embodiments, the interlayer dielectric 102 may include a low-k material having a smaller dielectric constant than silicon dioxide. In particular, the low-k dielectric may have a dielectric constant smaller than 4. In some embodiments, the low-k dielectric may be an ultra-low-k material having a dielectric constant smaller than 2.4.

In some embodiments, the low-k dielectric may include a chemical compound including oxygen, such as, for example, a fluorosilicate glass, carbon-doped silicon dioxide, porous silicon dioxide, porous carbon-doped silicon dioxide, hydrogen silsesquioxane and/or methylsilsesquioxane.

The interlayer dielectric 102 may be formed by means of known techniques for depositing an interlayer dielectric, for example, chemical vapor deposition, plasma-enhanced chemical vapor deposition and/or spin coating. In some embodiments, a surface of the interlayer dielectric 102 may be planarized after the deposition of the interlayer dielectric 102, for example by means of a chemical mechanical polishing process. In embodiments wherein the interlayer dielectric 102 is deposited by means of deposition techniques that allow obtaining a substantially planar surface of the deposited material, such as, for example, spin coating, a planarization of the interlayer dielectric 102 after the deposition thereof may be omitted.

In the interlayer dielectric 102, a trench 103 may be provided. The trench 103 may be formed by means of techniques of photolithography and etching. In some embodiments, in addition to the trench 103, one or more contact vias may be formed in the interlayer dielectric 102, which, when filled with an electrically conductive material, may provide electrical connections between an electrically conductive line that will be formed in the trench 103 and electrically conductive lines in lower interconnect levels and/or circuit elements in the substrate. Similar to the trench 103, the contact vias may be formed by means of techniques of photolithography and etching.

After the formation of the trench 103 and, optionally, contact vias in the interlayer dielectric 102, a diffusion barrier layer 104 may be deposited over the semiconductor structure. The diffusion barrier layer 104 may include a layer of a barrier metal that is suitable for substantially preventing or at least reducing a diffusion of copper through the diffusion barrier layer 104. In some embodiments, the diffusion barrier layer 104 may include titanium, tantalum, tungsten and/or an alloy including one or more of these materials. In other embodiments, the diffusion barrier layer 104 may include a metal nitride suitable for substantially preventing or at least reducing a diffusion of copper through the diffusion barrier layer 104, such as, for example, titanium nitride, tantalum nitride, tungsten nitride and/or mixtures thereof.

The diffusion barrier layer 104 need not be a substantially homogeneous material layer. In other embodiments, the diffusion barrier layer 104 may include a plurality of sub-layers having different compositions, wherein one or more of the sub-layers may include a metal and/or a metal nitride as described above.

Further features of the diffusion barrier layer 104 may correspond to those of conventional diffusion barrier layers employed in the formation of integrated circuits wherein electrically conductive lines including copper are used for providing electrical connections between circuit elements.

For forming the diffusion barrier layer 104, deposition techniques such as chemical vapor deposition, physical vapor deposition and/or atomic layer deposition may be employed.

On the diffusion barrier layer 104, a seed layer 106 may be provided. The seed layer 106 may be provided directly on the diffusion barrier layer 104, so that there is an interface between the diffusion barrier layer 104 and the seed layer 106, wherein the seed layer 106 contacts the diffusion barrier layer 104.

The seed layer 106 may include an alloy of copper and a metal other than copper. In some embodiments, the metal other than copper may include manganese, so that the seed layer 106 includes a copper manganese alloy. A manganese content of the seed layer 106 may be in a range from about 0.1-2 atomic percent. The seed layer 106 may have a thickness in a range from about 30-70 nm.

For forming the seed layer 106, deposition techniques such as chemical vapor deposition, plasma enhanced chemical vapor deposition and/or physical vapor deposition may be employed. In other embodiments, the seed layer 106 may be formed by means of electroless plating.

After the formation of the seed layer 106, an electrically conductive material 107 may be deposited on the seed layer 106. The electrically conductive material 107 may be provided in the form of substantially pure copper, or the electrically conductive material 107 may include a copper alloy. In embodiments wherein the electrically conductive material 106 includes a copper alloy, the copper alloy may be an alloy of copper and a metal that is different from the metal other than copper of the seed layer 106, for example, an alloy of copper and aluminum. The electrically conductive material 107 may be deposited by means of techniques of electroplating.

Figure 2:
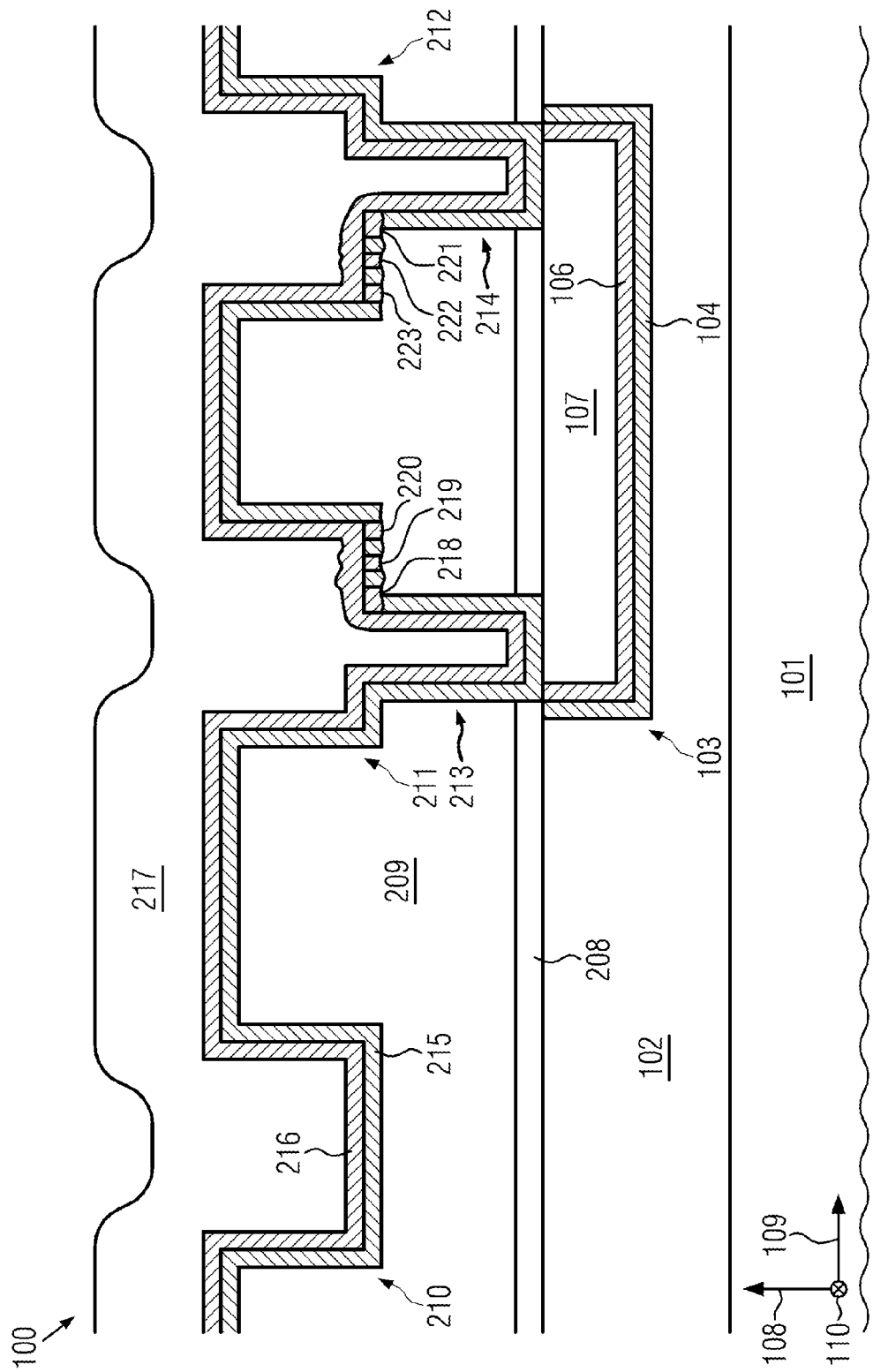

FIG. 2 shows a schematic cross-sectional view of the semiconductor structure 100 in a later stage of the manufacturing process. After the deposition of the electrically conductive material 107, a chemical mechanical polishing process may be performed. In the chemical mechanical polishing process, portions of the diffusion barrier layer 104, the seed layer 106 and the electrically conductive material outside the trench 103 which have been deposited on the top surface of the interlayer dielectric 102 may be removed. Moreover, a substantially planar surface of the semiconductor structure 100 may be obtained.

Thereafter, a capping layer 208 may be formed on the semiconductor structure 100. The capping layer 208 may include an electrically insulating material having diffusion barrier properties for copper, such as, for example, silicon nitride and/or silicon carbon nitride. In other embodiments, the capping layer 208 may include an oxygen compound, for example, silicon dioxide and/or silicon oxynitride. In some embodiments, the capping layer 208 may include a plurality of sub-layers. For example, in some embodiments, the capping layer 208 may include a first sub-layer formed of an oxygen compound, such as silicon dioxide or silicon oxynitride, that is provided directly on a surface of the electrically conductive material 107 in the trench 103, and a second sub-layer of another material, such as, for example, silicon nitride or silicon carbon nitride, that is provided on the first sub-layer. This may help to improve a segregation of the metal other than copper from the seed layer 106, as will be described in more detail below. The capping layer 208 may be formed of a different material than the diffusion barrier layer 104.

After the formation of the capping layer 208, an interlayer dielectric 209 may be formed on the capping layer 208. Features of the interlayer dielectric 209 may correspond to features of the interlayer dielectric 102 described above, and corresponding methods may be employed for the formation thereof.

After the formation of the interlayer dielectric 209, trenches 210, 211, 212 and contact vias 213, 214 may be formed in the interlayer dielectric 209. For the formation of the trenches 210, 211, 212 and the contact vias 213, 214, techniques of photolithography and etching may be employed.

As shown in FIG. 2, the trenches 210, 211, 212 may have a direction of elongation that is substantially parallel to the second horizontal direction 110, which extends perpendicular to the plane of drawing of FIG. 2, and the trench 103 may have a direction of elongation that is substantially parallel to the first horizontal direction 109 which extends horizontally in the cross-sectional view of FIG. 2. In other embodiments, the directions of elongation of the trenches 103, 210, 211, 212 may be arranged differently. In particular, in some embodiments, the directions of elongation of one or more of the trenches 210, 211, 212 may be arranged substantially parallel to the direction of elongation of the trench 103, or one or more of the trenches 210, 211, 212 may have a direction of elongation that is arranged obliquely to the direction of elongation of the trench 103. Moreover, an arrangement of contact vias may be different from the arrangement of the contact vias 213, 214 shown in FIG. 2.

As shown in FIG. 2, at the bottom of the contact vias 213, 214, the electrically conductive material 107 in the trench 103 may be exposed after the formation of the contact vias 213, 214.

After the formation of the trenches 210, 211, 212 and the contact vias 213, 214, a diffusion barrier layer 215 and a seed layer 216 may be deposited over the semiconductor structure. The diffusion barrier layer 215 may have features corresponding to those of the diffusion barrier layer 104, and corresponding techniques may be employed for the formation thereof. The seed layer 216 may have features corresponding to those of the seed layer 106, and corresponding techniques may be employed for the formation thereof.

The diffusion barrier layer 215 may cover side surfaces of the trenches 210, 211, 212 and the contact vias 213, 214, as well as bottom surfaces of the trenches 210, 211, 212 where the diffusion barrier layer contacts the interlayer dielectric 209. Additionally, the diffusion barrier layer 215 may be provided at the bottom of the contact vias 213, 214, where the diffusion barrier layer 215 contacts the electrically conductive material 107 in the trench 103. Further portions of the diffusion barrier layer 215 may be provided at a top surface of the interlayer dielectric 209 between the trenches 210, 211, 212. The seed layer 216 may be provided on the diffusion barrier layer 215.

After the formation of the diffusion barrier layer 215 and the seed layer 216, an electrically conductive material 217 may be deposited over the diffusion barrier layer 216. Features of the electrically conductive material 217 may correspond to those of the electrically conductive material 107 described above and corresponding techniques may be employed for the deposition thereof.

The diffusion barrier layer 215 may have defects 218 to 223. The defects may include pores and/or cracks in the diffusion barrier layer 215. The defects 218 to 223 may be formed during the deposition of the diffusion barrier layer and/or during processing steps that are performed after the deposition of the diffusion barrier layer 215, such as the deposition of the seed layer 216 and/or the electrically conductive material 217, or during processes of chemical mechanical polishing, annealing and/or deposition of further material layers on the semiconductor structure 100.

As shown in FIG. 2, defects 218 to 223 may occur at locations close to the transition between the contact via 213 and the trench 211 and close to the transition between the contact via 214 and the trench 212. Due to the relatively high curvature of the diffusion barrier layer 215 at such locations, these locations may be particularly susceptible to the formation of defects. However, defects similar to defects 218 to 223 may also occur at other locations of the diffusion barrier layer 215. Moreover, defects may also be present in the diffusion barrier layer 104 in the trench 103.

At the locations of the defects 218 to 223, the seed layer 216 may contact the interlayer dielectric 209. At locations other than the locations of the defects 218 to 223 of the diffusion barrier layer 215, the seed layer 216 is separated from the interlayer dielectric 209 by the diffusion barrier layer 215, so that the diffusion barrier layer 215 prevents a contact between the material of the seed layer 216 and the interlayer dielectric 209.

Figure 3:
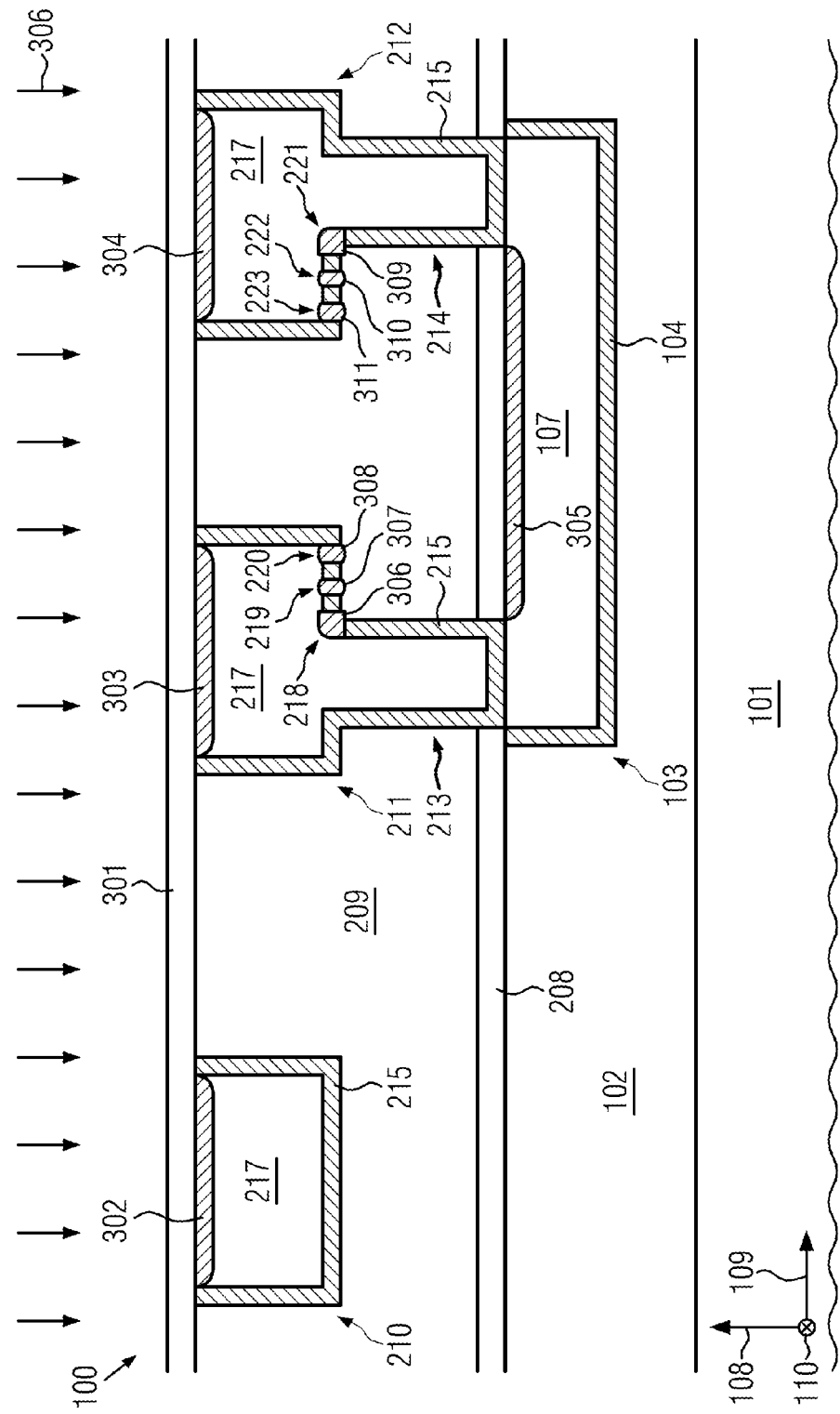

FIG. 3 shows a schematic cross-sectional view of the semiconductor structure 100 in a later stage of the manufacturing process. After the deposition of the electrically conductive material 217, a chemical mechanical polishing process may be performed, wherein portions of the diffusion barrier layer 215, the seed layer 216 and the electrically conductive material 217 outside the trenches 210, 211, 212 and the contact vias 213, 214 are removed, and wherein a surface of the semiconductor structure 100 is planarized. Thereafter, a capping layer 301 may be deposited. The capping layer 301 may have features corresponding to those of capping layer 208, and corresponding techniques may be employed for the formation thereof.

After the formation of the capping layer 301, an annealing process may be performed, as schematically denoted by reference numeral 306 in FIG. 3. The annealing process 306 need not be performed directly after the formation of the capping layer 301. In other embodiments, the annealing process 306 may be performed after the formation of one or more further interconnect layers above the capping layer 301, wherein each of the one or more further interconnect layers may include an interlayer dielectric similar to the interlayer dielectrics 102, 209, trenches similar to the trenches 103, 210, 211, 212 and contact vias similar to the contact vias 213, 214. In the trenches and contact vias of each of the one or more further interconnect layers, a diffusion barrier layer similar to diffusion barrier layers 104, 215, a seed layer similar to seed layers 106, 216 and an electrically conductive material similar to the electrically conductive materials 107, 217 may be provided, and capping layers similar to capping layers 208, 301 may be provided on top of each of the one or more interconnect layers.

The annealing process 306 may be a furnace annealing process, wherein the semiconductor structure 100 is inserted into a furnace and is maintained at a temperature at a range from about 100-250° C. for a duration in a range from about 15 minutes to about 2 hours.

During the annealing process 306, a segregation of the metal other than copper from the seed layers 106, 216 may occur. Atoms of the metal other than the copper from the seed layers 106, 216 may diffuse through the electrically conductive material 107 and the electrically conductive material 217, respectively.

Atoms of the metal other than copper from the seed layer 106 may diffuse through the electrically conductive material 107 in the trench 103 and may arrange at locations that are favorable from a thermodynamic point of view and/or wherein the atoms of the metal other than copper take part in chemical reactions. In some embodiments, atoms of the metal other than copper can react chemically with oxygen from the capping layers 208, 301. In particular, atoms of the metal other than copper may be trapped in a vicinity of the capping layer 208, so that a region 305 having a relatively high concentration of the metal other than copper may be obtained in the vicinity of the interface between the capping layer 208 and the electrically conductive material 107.

If the diffusion barrier layer 104 is intact, relatively low concentrations of the metal other than copper from the seed layer 106 may be obtained at the original locations of the seed layer 106 in the vicinity of the diffusion barrier layer 104, for example since locations in the vicinity of diffusion barrier layer 104 may be less favorable from a thermodynamic point of view for atoms of the metal other than copper from the seed layer 106 than locations in the vicinity of the capping layer 208.

Similarly, atoms of the metal other than copper from the seed layer 216 may diffuse through the electrically conductive material 217 in the trenches 210, 211, 212 and the contact vias 213, 214, and may arrange in a vicinity of the capping layer 301. Thus, regions 302, 303, 304 having a relatively high concentration of the metal other than copper from the seed layer 216 may be obtained, whereas a concentration of the metal other than copper may be relatively low at the original locations of the seed layer 216 in the vicinity of the diffusion barrier layer 215.

If the diffusion barrier layer 215 has defects 218 to 223, where the seed layer 216 contacts the interlayer dielectric 209, the metal other than copper from the seed layer 216 may diffuse into the interlayer dielectric 209 and/or react chemically with the interlayer dielectric 209. In particular, in embodiments wherein the interlayer dielectric 209 includes an oxygen compound, oxides of the metal other than copper from the seed layer 216 may be formed. In addition to chemical reactions between the metal other than copper from the seed layer 216 and the interlayer dielectric 209, the metal other than copper from the seed layer 216 may be captured in the interlayer dielectric 209 by other processes, such as an incorporation into pores of the interlayer dielectric 209, which may, in particular, be present in porous low-k dielectric materials.

Accordingly, in the vicinity of the defects 218 to 223 of the diffusion barrier layer 215, regions 306 to 311 having a relatively high concentration of the metal other than copper from the seed layer 216 may be obtained.

If the diffusion barrier layer 215 is intact, it can substantially prevent or at least reduce a diffusion of the metal other than copper from the seed layer 216 through the diffusion barrier layer 215 into the interlayer dielectric 209. Therefore, a concentration of the metal other than copper from the seed layer 216 remains low in portions of the interlayer dielectric 209 in the vicinity of intact portions of the diffusion barrier layer 215, and a relatively high concentration of the metal layer 216 other than copper is obtained substantially only in the regions 302, 303, 304. Consequently, the presence of regions 306 to 311 having a relatively high concentration of the metal other than copper from the seed layer 216 at locations other than in the vicinity of the interface between the electrically conductive material 217 and the capping layer 301 may be indicative of the presence of defects of the seed layer 215.

Similarly, if the diffusion barrier layer 104 in the trench 103 has defects, regions having a relatively high concentration of the metal other than copper from the seed layer 106 can be obtained in the vicinity of the defects in the diffusion barrier layer 104, whereas, in the absence of such defects, the metal other than copper from the seed layer 106 substantially diffuses away from the vicinity of the diffusion barrier layer 104 into the region 305.

Providing a material other than copper such as manganese in the seed layers 106, 216 may have effects other than the formation of regions 306 to 311 having a relatively high concentration of the metal other than copper which are indicative of the presence of defects in the diffusion barrier layer 104 and/or the diffusion barrier layer 215. Such effects may be helpful for improving an integrated circuit formed from the semiconductor structure 100. Regions 302, 303, 304, 305 having a relatively high concentration of the metal other than copper, in particular, when including manganese, may be helpful for reducing a likelihood of electromigration and/or stress migration occurring at the interface between the electrically conductive material 107 and the capping layer 208, and at the interface between the electrically conductive material 217 and the capping layer 301.

After the annealing process 306, a distribution of the metal other than copper in the semiconductor structure 100, or at least in portions thereof from which a sample is formed, may be measured. From the measured distribution of the metal, it can be determined if regions 306 to 311 having a relatively high concentration of the metal other than copper are present in the vicinity of any of the diffusion barrier layers 104, 215, such regions 306 to 311 being indicative of the presence of defects in the diffusion barrier layer 104 and/or the diffusion barrier layer 215. The measurement of the distribution of the metal other than copper, and the determination if portions of the metal other than copper in regions 306 to 311 are present will be described in detail below.

As detailed above, seed layers 106, 216 including a metal other than copper, for example, seed layers 106, 216 including manganese, may be provided in semiconductor structures from which integrated circuits for use in electronic components are formed without adversely affecting the performance of the integrated circuits, and they may even help to improve the performance of integrated circuits. Therefore, measuring a distribution of the metal other than copper and determining if regions 306 to 311 are present may be used for monitoring processes employed for the manufacturing of integrated circuits in view of the quality of diffusion barrier layers 104, 215, without requiring the formation of specific test structures. Furthermore, techniques as described herein may be employed for reverse engineering of integrated circuits wherein seed layers 106, 216 including a metal other than copper, for example, seed layers including manganese, have been employed for reducing the likelihood of electromigration occurring in electrically conductive lines.

The measurement of the distribution of the metal other than copper from the seed layers 106, 216 may be performed by means of techniques of analytical electron microscopy.

The measurement of the distribution of the metal other than copper from the seed layers 106, 216 may include transmission electron microscopy combined with energy dispersive X-ray spectroscopy (EDX). In such embodiments, a sample from the semiconductor structure 100 provided in the form of a slice from the semiconductor structure 100 may be irradiated with electrons that are transmitted through the sample, and X-ray spectra of X-rays that are emitted by the sample in response to the irradiation with electrons are determined. The X-ray spectra may be representative of the distribution of chemical elements in the sample. Energy dispersive X-ray spectroscopy may be performed in scanning transmission electron microscopy mode (STEM/EDX).

In other embodiments, the measurement of the distribution of the metal other than copper may include electron energy loss spectroscopy (EELS), wherein a spectrum of electron energy losses may be measured. A sample including a relatively thin slice of the semiconductor structure 100, the preparation of which will be described below, is irradiated with a beam of electrons. Electrons interacting with the sample may be diffracted inelastically, wherein both the direction of movement of the electrons and the energy of the electrons change. The energy loss of the inelastically diffracted electrons may be characteristic of the interaction between the electrons and the atoms in the sample, which may depend on the chemical composition of the sample. Thus, determining energies of inelastically diffracted electrons in the investigation of a sample from the semiconductor structure 100 may allow determining a distribution of chemical elements in the sample. Electron energy loss spectroscopy may be performed in scanning transmission electron microscopy mode (STEM/EELS). The electron energy loss spectrum may be representative of the composition of the sample.

In further embodiments, techniques of analytical electron microscopy which may be employed for the measurement of the distribution of the metal other than copper from the seed layers 106, 216 may include energy filtered transmission electron microscopy (EFTEM). In energy filtered transmission electron microcopy, which may be performed in bright field transmission electron microscopy mode (TEM/EFTEM), an intensity of electrons having a particular energy loss may be measured, which may be representative of a composition of the sample.

In other embodiments, techniques of scanning electron microscopy may be employed for measuring the distribution of the metal other than copper. In scanning electron microscopy, a sample from the semiconductor structure 100 is scanned in a raster scan pattern by an electron beam, and the beam's position is combined with a detected signal obtained in response to the irradiation of the sample from the semiconductor structure 100 with the electrons. Different from transmission electron microscopy, in scanning electron microscopy, electrons need not be transmitted through the sample, so that the sample need not be a thin slice of the semiconductor structure 100 but may have a relatively high thickness. For example, structures inside the semiconductor structure 100 may be investigated by means of scanning electron microscopy by cutting the semiconductor structure 100, as will be described in more detail below.

Techniques of scanning electron microscopy that may be used in embodiments may include scanning electron microscopy combined with energy dispersive X-ray spectroscopy, wherein X-ray spectra of X-rays emitted from the sample of the semiconductor structure 100 in response to the irradiation with electrons are analyzed by means of an energy sensitive X-ray detector for determining the distribution of the metal other than copper from the seed layers 106, 216 in the semiconductor structure 100. Further techniques may include scanning electron microscopy combined with wavelength dispersive X-ray spectroscopy, wherein X-ray spectra emitted from the sample of the semiconductor structure 100 are determined by diffraction of the X-rays at a single crystal, and scanning electron microscopy combined with a detection of Auger electrons, wherein spectra of Auger electrons emitted by the sample of the semiconductor structure 100 in response to the irradiation with electrons are analyzed to determine the distribution of the metal other than copper from the seed layers 106, 216 in the semiconductor structure 100.

FIG. 4 shows a schematic perspective view illustrating the preparation of a sample of the semiconductor structure 100 that may be employed for measuring the distribution of the metal other than copper from the seed layers 106, 206 by means of techniques of analytical scanning electron microscopy as described above. For preparing the sample of the semiconductor structure 100, the semiconductor structure 100 may be cut along a plane 401 that is substantially parallel to the thickness direction 108 of the semiconductor structure 100. Moreover, the plane 401 may be substantially parallel to the first horizontal direction 109, and the plane 401 may be at a location selected such that the plane 401 runs through the features of the semiconductor structure 100 described above with respect to FIGS. 1-3. Reference numeral 402 schematically illustrates a location of the cut on the surface of the semiconductor structure 100. After cutting the semiconductor structure 100, a cross-section of the semiconductor structure 100 corresponding to the cross-sectional view shown in FIG. 3 may be exposed at the cut face of the semiconductor structure 100. Thus, the features of the semiconductor structure 100 described above may be investigated by means of scanning electron microscopy, wherein the cut face of the semiconductor structure 100 is irradiated with the electron beam of the scanning electron microscope.

For cutting the semiconductor structure 100, known processes of cutting by means of a beam of focused ions, for example gallium ions, may be used. In other embodiments, techniques of sawing the semiconductor structure 100 and/or polishing the exposed cut surface may be employed.

Figure 5:
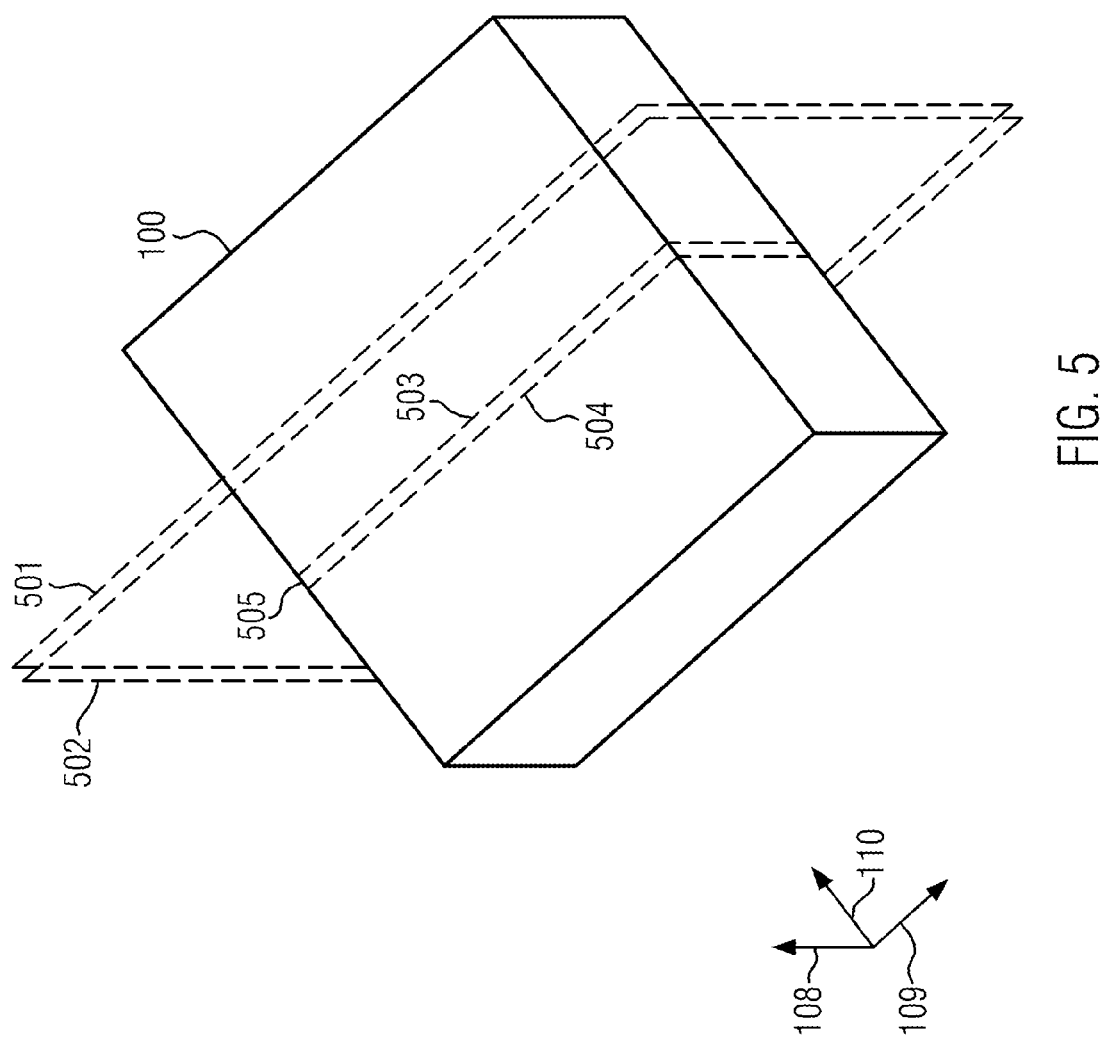
FIG. 5 shows a schematic perspective view illustrating a preparation of a sample from a semiconductor structure in a method according to an embodiment.

FIG. 5 shows a schematic perspective view illustrating the preparation of a sample from the semiconductor structure 100 that may be used for measuring the distribution of the metal other than copper from the seed layers 106, 216 by means of transmission electron microscopy. Reference numerals 501, 502 schematically denote a first plane and a second plane, respectively. The semiconductor structure 100 may be cut along the first plane 501 and along the second plane 502, such that a slice 505 of the semiconductor structure 100 is obtained. Reference numerals 503, 504 schematically denote the locations of the cuts on the surface of the semiconductor structure 100. Similar to the cutting plane 401 described above with respect to FIG. 4, the planes 501, 502 may be substantially parallel to the thickness direction 108 of the substrate 101. Furthermore, the planes 501, 502 may be substantially parallel to the first horizontal direction 109 and may be provided at a location of the semiconductor structure 100 that is selected such that the slice 505 substantially corresponds to the cross-sectional view of the semiconductor structure 100 shown in FIG. 3.

A thickness direction of the slice 505, being substantially a direction of normals of the planes 501, 502, may be substantially parallel to the second horizontal direction 110, thus being substantially perpendicular to the thickness direction 108 of the substrate 101.

In some embodiments, the thickness of the slice 505 may be reduced after cutting the semiconductor structure 100 using known techniques for the preparation of samples for transmission electron microscopy, such as chemical etching and/or ion etching.

The present disclosure is not limited to embodiments wherein only the distribution of the metal other than copper from the seed layers 106, 216 in the sample from the semiconductor structure 100 is measured. In some embodiments, distributions of other chemical elements in the sample from the semiconductor structure 100 may also be measured, for example, a distribution of chemical elements which are present in the diffusion barrier layers 104, 215, such as, for example, titanium, tantalum and/or tungsten.

Figure 6:
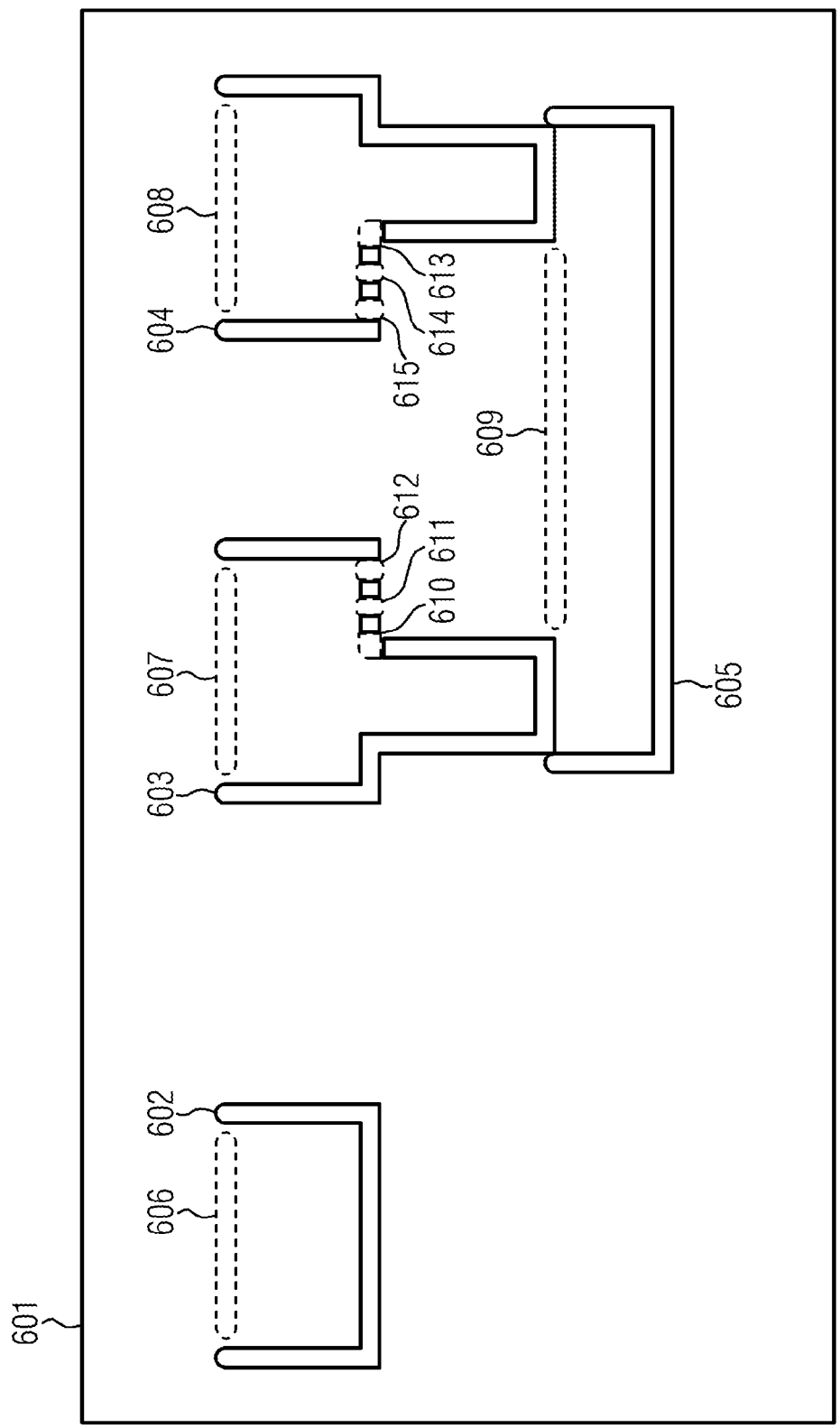
FIG. 6 schematically illustrates results of a measurement of a distribution of chemical elements in a semiconductor structure in a method according to an embodiment.

FIG. 6 schematically illustrates an image 601 obtainable by analytical electron microscopy of a sample of the semiconductor structure 100 including the features of the semiconductor structure 100 illustrated in the cross-sectional view of FIG. 3. In FIG. 6, areas 602, 603, 604, 605 enclosed by solid lines illustrate portions of the image 601 wherein a relatively high intensity of a signal indicative of the presence of a chemical element from the diffusion barrier layers 104, 215 is obtained. The shape of the areas 602, 603, 604, 605 substantially corresponds to the shape of the diffusion barrier layers 104, 215 as illustrated in FIG. 3.

Moreover, in FIG. 6, areas 606 to 615 enclosed by dashed lines schematically illustrate portions of the image 601 wherein a relatively high intensity of a signal representative of a density of the metal other than copper from the seed layers 106, 216 has been measured.

In embodiments wherein the diffusion barrier layers 104, 215 include tantalum, and the seed layers 106, 216 include an alloy of copper and manganese, the areas 602 to 605 in image 601 may correspond to regions of the semiconductor structure 100 wherein a relatively high intensity of a signal representative of a concentration of tantalum has been measured, and areas 606 to 615 may correspond to regions of the semiconductor structure 100 wherein a relatively high intensity of a signal representative of a concentration of manganese has been measured.

Areas 606 to 609 in image 601 correspond to regions 302, 303, 304, 305, wherein a relatively high concentration of the metal other than copper from the seed layers 106, 216 is obtained due to the segregation of the metal other than copper. Accordingly, areas 606 to 609 may be present in the image 601 both in the presence of defects in the diffusion barrier layers 104, 115 and in the absence of such defects. Areas 610 to 615 in the image 601 correspond to the regions 306 to 311 in the semiconductor structure 100 wherein a relatively high concentration of the metal other than copper from the seed layers 106, 216 is obtained when defects 218 to 223 are present in the diffusion barrier layer 215. Areas 606 to 609, and areas 610 to 615 may be distinguished from each other due to their location in the semiconductor structure 100. The location of areas 610 to 615 in the vicinity of the diffusion barrier layers 104, 215 is different from the location of areas 606 to 609, which are arranged in a vicinity of an interface between the electrically conductive materials 107, 217 and the cap layers 208, 301, at a distance to the diffusion barrier layers 104, 215.

Consequently, from the presence or absence of regions 610 to 615 in the image 601, it may be determined if regions 306 to 311, which are indicative of the presence of defects 218 to 223 in the diffusion barrier layer 215, are present, so that it may be determined from the image 601 if the diffusion barrier layer 215 has defects or not.

If the diffusion barrier layer 215 and/or the diffusion barrier layer 104 has defects at locations other than those of defects 218 to 223 shown in FIG. 3, the image 601 may include areas wherein a relatively high intensity of a signal representative of the concentration of the metal other than copper from the seed layers 106, 216 is measured at locations which approximately correspond to the locations of these defects.

Determining, from the image 601, if regions 306 to 311 are present in the semiconductor structure 100 may be performed by an operator by means of inspection of the image 601, or it may be performed automatically by processing the image 601 by means of image processing techniques.

In some embodiments, a sample from the semiconductor structure 100 that is used for measuring the distribution of the metal other than copper from the seed layers 106, 216 may be obtained from a portion of the semiconductor structure 100 wherein an integrated circuit is formed. Thus, an integrated circuit, for example one of a plurality of integrated circuits formed on a wafer, may be destroyed in the preparation of the sample. Other integrated circuits on the wafer may remain intact.

In other embodiments, structures as shown in FIGS. 1-3 may be provided in a specific test structure that may be located, for example, at a scribe line of a wafer between integrated circuits formed on the wafer. Thus, a destruction of integrated circuits for monitoring the integrity of diffusion barrier layers may be avoided, which may be particularly helpful for inline non-destructive diffusion barrier integrity monitoring.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
providing a semiconductor structure comprising a diffusion barrier layer formed above a dielectric material and a seed layer provided on said diffusion barrier layer, said seed layer comprising an alloy of copper and a metal other than copper;
depositing an electrically conductive material comprising copper on said seed layer;
performing an annealing process after depositing said electrically conductive layer, wherein at least a first portion of said metal other than copper diffuses away from a vicinity of said diffusion barrier layer through said electrically conductive material, and wherein, in case of a defect in said diffusion barrier layer, a second portion of said metal other than copper indicative of said defect is present in said dielectric material in a vicinity of said defect in said diffusion barrier layer at a higher concentration relative to other portions of said dielectric material in the vicinity of said diffusion barrier without said defect;

measuring a distribution of said metal other than copper in at least a portion of said semiconductor structure; and determining, from said measured distribution of said metal other than copper, if said second portion of said metal other than copper is present in said dielectric material at said higher concentration in a vicinity of said diffusion barrier layer to identify said defect.

2. The method of claim 1, wherein said metal other than copper comprises manganese.

3. The method of claim 2, wherein said diffusion barrier layer substantially does not comprise manganese.

4. The method of claim 3, wherein said diffusion barrier layer comprises at least one of titanium, tantalum, tungsten, titanium nitride, tantalum nitride and tungsten nitride.

5. The method of claim 3, wherein said deposited electrically conductive material substantially does not comprise manganese.

6. The method of claim 5, wherein said deposited electrically conductive material comprises at least one of substantially pure copper and an alloy comprising at least copper and aluminum.

7. The method of claim 1, wherein said semiconductor structure comprises a recess provided in an interlayer dielectric.

8. The method of claim 7, wherein said recess comprises at least one of a trench and a contact via.

9. The method of claim 7, wherein said interlayer dielectric comprises at least one of silicon dioxide and a low-k material having a dielectric constant smaller than a dielectric constant of silicon dioxide.

10. The method of claim 9, wherein said interlayer dielectric comprises a low-k material comprising an oxygen compound.

11. The method of claim 10, wherein said low-k material comprises at least one of a fluorosilicate glass, carbon-doped silicon dioxide, porous silicon dioxide, porous carbon-doped silicon dioxide, hydrogen silsesquioxane and methylsilsesquioxane.

12. The method of claim 1, wherein measuring the distribution of said metal other than copper in at least a portion of said semiconductor structure comprises performing analytical electron microscopy.

13. The method of claim 12, wherein said analytical electron microscopy comprises at least one of energy filtered transmission electron microscopy, scanning transmission electron microscopy combined with energy dispersive X-ray spectroscopy, scanning transmission electron microscopy combined with electron energy loss spectroscopy, scanning electron microscopy combined with energy dispersive X-ray spectroscopy, scanning electron microscopy combined with wavelength dispersive X-ray spectroscopy, and scanning electron microscopy combined with a detection of Auger electrons.

14. The method of claim 12, wherein said analytical electron microscopy comprises scanning transmission electron microscopy combined with energy dispersive X ray spectroscopy.

15. The method of claim 12, wherein performing analytical electron microscopy comprises preparing a sample from said semiconductor structure.

16. The method of claim 15, wherein said semiconductor structure comprises a substrate, and wherein the preparation of said sample comprises cutting said semiconductor structure along a plane substantially parallel to a thickness direction of said substrate.

17. The method of claim 15, wherein the preparation of said sample comprises cutting a slice from said semiconductor substrate, a thickness direction of said slice being substantially perpendicular to a thickness direction of said substrate.

18. A method, comprising:

providing a semiconductor structure, said semiconductor structure comprising:

an interlayer dielectric provided above a substrate, a recess provided in said interlayer dielectric, said recess comprising at least one of a contact via and a trench, a diffusion barrier layer provided on at least one of a bottom and a sidewall of said recess, said diffusion barrier layer comprising at least one of titanium, tantalum, tungsten, titanium nitride, tantalum nitride and tungsten nitride, and a seed layer provided on said diffusion barrier layer, said seed layer comprising an alloy of copper and manganese;

depositing an electrically conductive material comprising copper on said seed layer, wherein said deposited electrically conductive material substantially does not comprise manganese;

performing an annealing process after depositing said electrically conductive material, wherein at least a first portion of said manganese diffuses away from a vicinity of said diffusion barrier layer through said electrically conductive material and wherein, in case of a defect in said diffusion barrier layer, a second portion of said manganese indicative of said defect is present in said interlayer dielectric in a vicinity of said defect in said diffusion barrier layer at a higher concentration relative to other portions of said interlayer dielectric in the vicinity of said diffusion barrier without said defect;

measuring a distribution of manganese in at least a portion of said semiconductor structure; and determining, from said measured distribution of manganese, if said second portion of said manganese is present in said interlayer dielectric at said higher concentration in a vicinity of said diffusion barrier layer to identify said defect.

19. A method, comprising:

providing a semiconductor structure comprising an interlayer dielectric and an electrically conductive feature at least partially surrounded by said interlayer dielectric, said electrically conductive feature comprising an electrically conductive material comprising copper and a diffusion barrier layer comprising at least one of a metal and a metal nitride between said electrically conductive material and said interlayer dielectric;

performing analytical electron microscopy to determine if said semiconductor structure comprises manganese and, if said semiconductor structure comprises manganese, to measure a distribution of said manganese; and identifying a defect in said diffusion barrier layer responsive to determining, from said measured distribution of said manganese, that a portion of said manganese is present in said interlayer dielectric in a vicinity of said diffusion barrier layer at a higher concentration relative to other portions of said interlayer dielectric in the vicinity of said diffusion barrier without said defect.

20. The method of claim 19, wherein said analytical electron microscopy comprises transmission electron microscopy.

* * * * *